United States Patent [19]

Matthies et al.

[11] Patent Number: 4,724,405
[45] Date of Patent: Feb. 9, 1988

[54] MODULATOR

[75] Inventors: Karl-Heinz Matthies, Hamburg; Gert F. H. Bierkarre, Escheburg, both of Fed. Rep. of Germany

[73] Assignee: U.S. Philips Corporation, New York, N.Y.

[21] Appl. No.: 941,497

[22] Filed: Dec. 15, 1986

[30] Foreign Application Priority Data

Dec. 19, 1985 [DE] Fed. Rep. of Germany ....... 3545006

[51] Int. Cl.$^4$ ............................................. H03C 1/00
[52] U.S. Cl. .................................. 332/31 T; 332/370; 358/40
[58] Field of Search ................. 332/16 T, 31 T, 37 D, 332/43 R, 43 B; 358/23, 24, 40; 455/108

[56] References Cited
U.S. PATENT DOCUMENTS
4,338,580 7/1982 Gay .................................. 332/31 T Primary Examiner—Eugene R. LaRoche
Assistant Examiner—Robert J. Pascal
Attorney, Agent, or Firm—Robert T. Mayer

[57] ABSTRACT

The invention relates to a modulator comprising a first differential amplifier (6) which receives an input signal and a correction signal for adjusting the quiescent currents on the first and second output. The first differential amplifier (6) is coupled to a second differential amplifier (19) and a third differential amplifier (22), which receive the carrier signal and which supply the modulated signal. A difference signal proportional to the difference between the current of the first output and the current of the second output of the first differential amplifier (40) is applied to a low-pass filter (25), whose output signal is applied to a control amplifier (40). The control amplifier (40) supplies the correction signal to the second input of the first differential amplifier (6) via a storage device (50).

9 Claims, 1 Drawing Figure

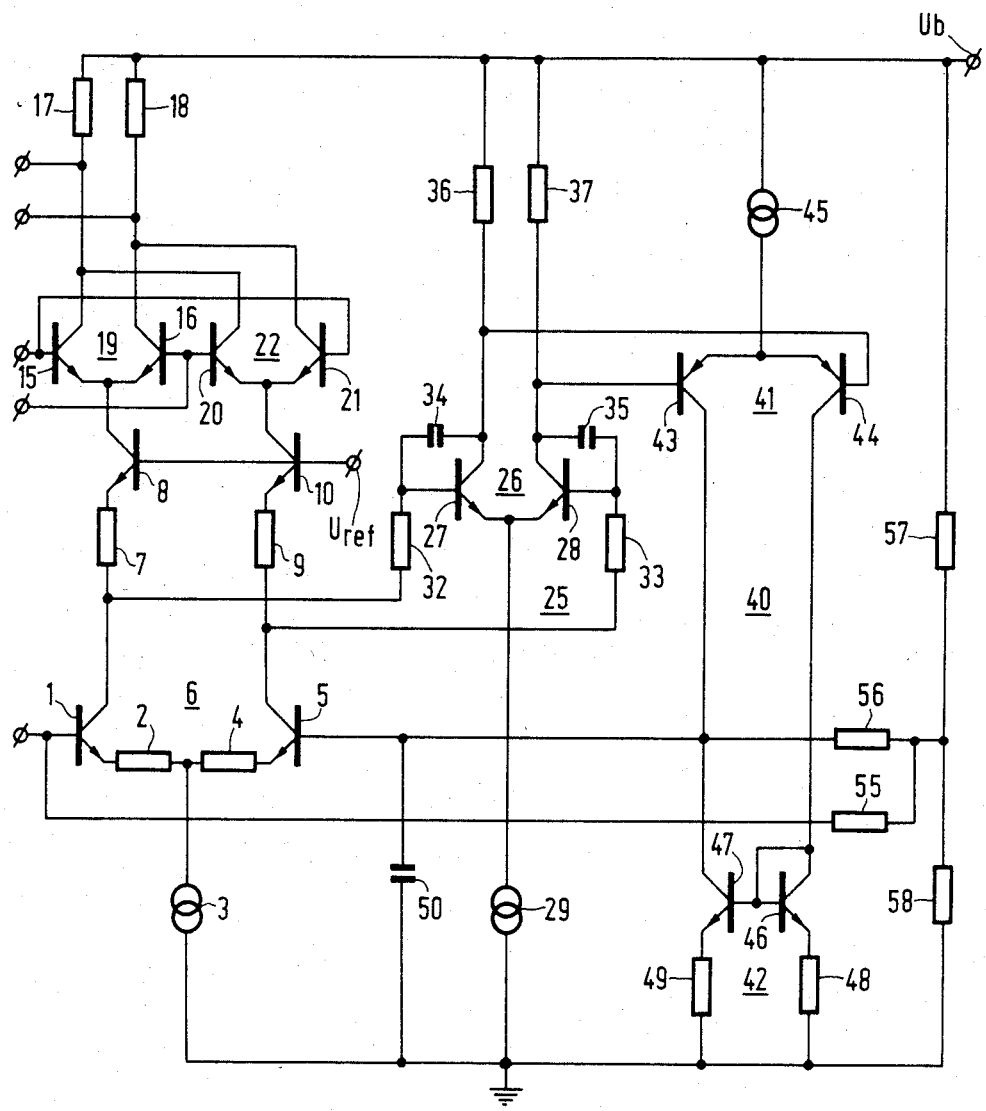

MODULATOR

BACKGROUND OF THE INVENTION

The invention relates to a modulator comprising a first differential amplifier having a first input for receiving an input signal and a second input for receiving a correction signal for adjusting a quiescent current on a first and a second output of the first differential amplifier; a second differential amplifier and a third differential amplifier, whose control inputs are each coupled to one of the two outputs of the first differential amplifier, having interconnected difference inputs for receiving a carrier signal and having interconnected difference outputs for supplying a modulated signal, and a control amplifier having an input coupled to means for at least temporarily applying to this input a difference signal which is proportional to the difference between the current on the first and the current on the second output of the first differential amplifier and having an output coupled to the second input of the first differential amplifier via a storage device.

Such a circuit arrangement is known from European Patent Specification No. 0,040,274 and may be employed in, for example, a video recorder in order to convert a chrominance signal from a higher to a lower frequency band during recording or from to a lower to a higher frequency band during reproduction. The chrominance signal comprises two signal components, the colour signal and the burst signal, which recur periodically and between which a signal gap occurs.

The first differential amplifier comprises two transistors whose emitters are coupled to a current source. The input signal is applied to the base of the first transistor and a correction signal is applied to the base of the second transistor. The collector of the first transistor is connected to the emitter of a third and the emitter of a fourth transistor, constituting the control input of the second differential amplifier, and the collector of the second transistor is connected to the emitter of a fifth and the emitter of a sixth transistor, constituting the control input of the third differential amplifier. The carrier signal is applied between the base of the third and the base of the fourth transistor. The base of the third and that of the fifth transistor and the base of the fourth and that of the sixth transistor are interconnected. The modulated signal is taken from the coupled difference outputs of the second and the third differential amplifier, i.e. the collector of the third and that of the fifth transistor and the collector of the fourth and that of the sixth transistor are interconnected.

For the conversion of the chrominance signal from a lower to a higher frequency band it is necessary that the quiescent currents of the collector of the first transistor and the collector of the second transistor be substantially equal in order to prevent the signal from being influenced by the subcarrier. The collector quiescent current of the first or the second transistor is the current which flows in the absence of an input signal.

In the known circuit arrangement the quiescent currents are corrected as follows. The control input of the second differential amplifier is connected to a first switching transistor and the control input of the third differential amplifier is connected to a second switching transistor. The two switching transistors are also connected to a control amplifier which is coupled to the base of the second transistor via an earthed capacitor. The differential amplifier supplies a correction signal for adjusting the quiescent currents. The switching transistors are cut off during the occurrence of the horizontal pulses, because there is a signal gap in the chrominance signal during this time. In order to guarantee that the switching transistors conduct only during the occurrence of the horizontal pulses a control circuit is necessary for controlling the switching transistors.

The control amplifier only generates a correction signal during the time in which the horizontal pulses appear, which correction signal is stored in the capacitor. Therefore, the capacitor is generally so large that it cannot be integrated when the modulator is constructed as an integrated circuit.

SUMMARY OF THE INVENTION

It is the object of the invention to construct a modulator of the type defined in the opening paragraph in such a way that a control amplifier without said control circuit constantly supplies a correction signal.

According to the invention this object is achieved in that said means comprise a low-pass filter rejecting the input signal and are constructed to supply the difference signal constantly to the control amplifier by way of said low-pass filter.

In the modulator in accordance with the invention the low-pass filter rejects the high-frequency components of the difference signal, so that the control amplifier receives a d.c. signal corresponding to the asymmetry of the quiescent currents. If the input signal is, for example, a chrominance signal the low-pass filter rejects the high-frequency burst signal and the high-frequency colour signal. In this case the control amplifier constantly receives a d.c. signal equal to the signal in the signal gap of the chrominance signal. In contradistinction to the prior art, the control amplifier constantly supplies a correction signal, so that the asymmetry of the quiescent currents is eliminated more rapidly. Moreover, the storage capacitance can be smaller as a result of the constant presence of a correction signal.

It is to be noted that from German PS 32 13 506 a circuit arrangement is known in which an a.c. signal is amplified by means of two differential amplifiers arranged in parallel. The outputs of the two differential amplifiers are connected to two transistors, which supply an amplified a.c. signal. This output signal is applied to a control circuit which comprises a first and a second low-pass filter and which generates a control signal which is applied to the output of one of the parallel-connected differential amplifiers. This control circuit provides compensation for the d.c. offset in the output signal. In the modulator in accordance with the invention it is necessary to make the quiescent currents on the outputs of the first differential amplifier equal to each other. It is not necessary to compensate for a d.c. offset in the output signal of the first differential amplifier and in the modulated signal. Moreover, the low-pass filter in the modulator in accordance with the invention receives the output signal of the first differential amplifier and not the output signal of the second and the third differential amplifier, that is of the two parallel-connected differential amplifiers.

A difference signal which is proportional to the difference between the current of the first output and the current of the second output of the first differential amplifier is generated in that by means of a current-sensing resistor the control input of the second differential amplifier and the control input of the third differential amplifier are each coupled to one of the two outputs of the first differential amplifier which are connected to the low-pass filter. It is alternatively possible to obtain a proportional difference signal by means of two current mirrors.

In one embodiment the low-pass filter comprises a fourth differential amplifier comprising two transistors whose bases each are connected to the output of the first differential amplifier by a resistor. The base-collector junctions of the transistors are each arranged in parallel with a capacitor, and their collectors constitute the output of the low-pass filter. When the gain factor of the fourth differential amplifier and the resistors are dimensioned correctly, the capacitors can also be integrated when the modulator is constructed as an integrated circuit. In another embodiment the control amplifier comprises a fifth differential amplifier which receives the output signal of the low-pass filter and which has its output coupled to a current mirror.

In order to enable the quiescent currents to be pre-adjusted the first input and the second input of the first differential amplifier are coupled to a reference-voltage source by a voltage divider. The voltage divider provides a pre-adjustment of the voltages on the inputs of the first differential amplifier.

In order to decouple the control input of the second and that of the third differential amplifier from the input of the low-pass filter the control input of the second and the control input of the third differential amplifier are each connected to the collector of a transistor whose emitter is coupled to one of the outputs of the first differential amplifier and whose base is at a reference potential.

The storage device in the modulator may be a capacitor which is connected to earth. Since the control amplifier constantly supplies the correction signal the capacitor is much smaller than in the known circuit arrangement. It is also possible to integrate this capacitor in the case of integration of the circuit arrangement if the control gain is selected accordingly.

In one embodiment the first differential amplifier comprises a transistor whose base constitutes the first input, whose collector constitutes the first output, and whose emitter is coupled to the emitter of a further transistor of the first differential amplifier, the base of said further transistor constituting the second input and its collector constituting the second output.

In another embodiment the second and the third differential amplifier each comprise two transistors whose coupled emitters constitute the control input, whose bases constitute the difference input, and whose collectors constitute the difference output.

The modulator may be used in a television receiver or a video recording and/or reproducing apparatus (for example, video recorders) where it may be utilized for converting a chrominance signal to another frequency band.

BRIEF DESCRIPTION OF THE DRAWING

Embodiments of the invention will now be described in more detail, by way of example, with reference to the accompanying drawing which shows the invention in diagrammatic detail.

DESCRIPTION OF THE PREFERRED EMBODIMENTS

The modulator shown in the drawing serves, for example, for modulating a chrominance signal reproduced by a video recorder from a first carrier having a frequency of 627 kHz onto a second carrier having a frequency of 4.43 MHz. The chrominance signal is applied to the base of an NPN transistor 1 whose emitter is connected to an earthed current source 3 by way of a resistor 2 and to the emitter of an NPN transistor 5 by way of a resistor 4. The base of the transistor 1 constitutes an input terminal of the first input of a first differential amplifier 6 comprising the transistors 1 and 5.

By means of a current-sensing resistor 7 the collector of the transistor 1 is connected to the emitter of an NPN transistor 8 and the collector of the transistor 5 is connected to the emitter of an NPN transistor 10 by way of a current-sensing resistor 9. The two current-sensing resistors 7 and 9 have the same resistance values. The base of the transistor 8 and that of a transistor 10 are connected to a low-impedance voltage source Uref. The collector of the transistor 8 is connected to the emitter of an NPN transistor 15 and to the emitter of an NPN transistor 16. The collector of the transistor 15 and that of the transistor 16 are each connected to a voltage source Ub by a resistor 17 and 18 respectively. The transistors 15 and 16 constitute a second differential amplifier 19.

The collector of transistor 10 is connected to the junction point between the emitter of an NPN transistor 20 and the emitter of an NPN transistor 21. The transistors 20 and 21 form the third differential amplifier and are coupled to the second differential amplifier 19 in the following manner. A carrier signal having a frequency of 5.06 MHz is applied between the first input terminal, which is constituted by the base of the transistor 15 and the base of the transistor 21, and the second input terminal, which is connected to the junction point between the base of the transistor 16 and the base of the transistor 20. The modulated signal is available between the collector of the transistor 15, which is connected to the collector of the transistor 20, and the collector of the transistor 16, which is connected to the collector of the transistor 21. The modulated signal contains the chrominance signal modulated on the carrier having a frequency of 4.43 MHz. In this way the three differential amplifiers 6, 19 and 22 form a four-quadrant multiplier, known per se. The transistors 8 and 10 serve for decoupling the differential amplifier 6 from the differential amplifiers 19 and 22.

In order to prevent the picture reproduction from being disturbed it is necessary that the collector quiescent current of the transistor 1 and that of the transistor 5 be equal. Since the transistors 1 and 5 cannot be made perfectly symmetrical a correction signal for adjusting the quiescent currents is applied to an input terminal of the second input of the first differential amplifier 6, that is to the base of the transistor 5.

A voltage proportional to the collector current of the transistor 1 is generated across the current-sensing resistor 7 and a voltage proportional to the collector current of the transistor 5 is generated across the current-sensing resistor 9. The difference between these voltages is the input voltage for a low-pass filter 25. The low-pass filter 25 comprises a fourth differential amplifier 26 comprising an NPN transistor 27 and an NPN transistor 28. The base of the transistor 27 is connected to the collector of the transistor 1 by way of a resistor 32 and the base of the transistor 28 is connected to the collector of the transistor 5 by way of resistor 33. The emitter of the transistor 27 and the emitter of the transistor 28 are connected to a current source 29 which is connected to earth. A capacitor 34 is arranged in parallel with the base-collector junction of the transistor 27 and a capacitor 35 is arranged in parallel with the base-collector junction of the transistor 28. The collector of the transistor 27 and that of the transistor 28 are also connected to the voltage source Ub by a resistor 36 and 37 respectively. The output signal of the low-pass filter 25 is available between the collector of the transistor 27 and that of the transistor 28. The fourth differential amplifier 26 has a gain factor of 6 to 7 and the resistors 32 and 33 each have a resistance value of 10 kohms. The two capacitors 34 and 35 have a capacitance of 8 pF, so that they can also be integrated when the modulator is constructed as an integrated circuit. The low-pass filter 25, which has a cut-off frequency of approximately 300 kHz, rejects the chrominance signal and produces a signal proportional to the difference between the collector quiescent currents.

The output signal of the low-pass filter 25 is applied to a control amplifier 40 which comprises a fifth differential amplifier 41 and a current mirror 42. The differential amplifier 41 comprises an PNP transistor 43 whose base is connected to the collector of the transistor 28 and an PNP transistor 44 whose base is connected to the collector of the transistor 27. The emitter of the transistor 43 and that of the transistor 44 are connected to a current source 45, which is connected to the voltage source Ub. The collector of the transistor 44 is connected to the collector of a NPN transistor 46 and to the base of this transistor and the base of an NPN transistor 47. In addition to the transistors 46 and 47 the current mirror 42 comprises a resistor 48, which is arranged between earth and the emitter of the transistor 46, and a resistor 49, which is connected to earth and to the emitter of the transistor 47. The collector of the transistor 43 and the collector of the transistor 47 are connected to the base of the transistor 5 and to an earthed capacitor 50. When the gain factor of the differential amplifier 41 is suitably selected the capacitor 50, which has a capacitance of 1 nF, can also be integrated, because as a result of the constant presence of a correction signal this capacitor is much smaller than in the prior art. The correction signal for the second input of the first differential amplifier 6 appears on the junction point between the collector of the transistor 43 and the collector of the transistor 47.

The base of the transistor 1 is connected to a resistor 55 and the base of the transistor 5 is connected to a resistor 56, which resistors are together connected to a voltage divider comprising the resistors 57 and 58. The resistor 57 is further connected to the voltage source Ub and the resistor 58 is connected to earth. The resistors 55 to 58 enable the quiescent currents to be pre-adjusted.

What is claimed is:

1. A modulator comprising a first differential amplifier having first and second inputs and first and second outputs, said first input for receiving an input signal and said second input for receiving a correction signal for adjusting quiescent currents on said first and second outputs; a second and third differential amplifier each having a control input coupled to a different one of the two outputs of said first differential amplifier, said second and third differential amplifiers having interconnected difference inputs for receiving a carrier signal and interconnected difference outputs for supplying a modulated signal; a control amplifier having an input; and means coupled to the input of said control amplifier for applying to said control amplifier input a difference signal which is proportional to the difference between the quiescent currents on said first and second outputs of said first differential amplifier, said control amplifier having an output coupled to the second input of the first differential amplifier by way of a storage device for supplying said correction signal thereto; said means comprising a low-pass filter receiving and filtering the output signals of said first differential amplifier, said low pass filter supplying said difference signal to said control amplifier on a steady state basis.

2. A modulator as claimed in claim 1 wherein a different current sensing resistor couples the control inputs of the second and third differential amplifiers to an associated one of the two outputs of said first differential amplifier.

3. A modulator as claimed in either of claims 1 or 2, wherein said low-pass filter comprises a fourth differential amplifier comprising two transistors whose bases are each connected to the output of the first differential amplifier by a resistor, whose base-collector junctions are each arranged in parallel with a capacitor, and whose collectors constitute the output of the low-pass filter.

4. A modulator as claimed in claim 3, wherein said control amplifier comprises a fifth differential amplifier and a current mirror, said fifth differential amplifier receiving the output signal of the low-pass filter and having its output coupled to said current mirror.

5. A modulator as claimed in claim 4 wherein the first input and the second input of the first differential amplifier are coupled to a reference-voltage source via a voltage divider.

6. A modulator as claimed in claim 5 wherein the control input of the second differential amplifier and the control input of the third differential amplifier are each connected to the collector of a transistor whose emitter is coupled to one of the outputs of the first differential amplifier and whose base is at a reference potential.

7. A modulator as claimed in claim 6, wherein the storage device is a capacitor having one terminal which is connected to a point of constant potential.

8. A modulator as claimed in claim 7, wherein the first differential amplifier comprises a transistor whose base constitutes the first input, whose collector constitutes the first output, and whose emitter is coupled to the emitter of a further transistor of the first differential amplifier, the base of said further transistor constituting the second input and its collector constituting the second output.

9. A modulator as claimed in claim 8, wherein the second differential amplifier and the third differential amplifier each comprise two transistors whose coupled emitters constitute the control input, whose bases constitute the difference input, and whose collectors constitute the difference output.

* * * * *